(12) United States Patent
Wang et al.

(10) Patent No.: US 7,954,541 B2
(45) Date of Patent: Jun. 7, 2011

(54) HEAT DISSIPATION MODULE

(75) Inventors: Feng-Ku Wang, Taipei (TW); Chih-Kai Yang, Taipei (TW); Huang-Cheng Ke, Taipei (TW); Yu-Chih Cheng, Taipei (TW); Cheng-Shang Chou, Taipei (TW)

(73) Assignee: Inventec Corporation, Taipei (TW)

( * ) Notice: Subject to any disclaimer, the term of this patent is extended or adjusted under 35 U.S.C. 154(b) by 806 days.

(21) Appl. No.: 12/018,602

(22) Filed: Jan. 23, 2008

(65) Prior Publication Data

US 2009/0056925 A1 Mar. 5, 2009

(30) Foreign Application Priority Data

Aug. 28, 2007 (TW) ................................ 96131838 A

(51) Int. Cl.
*F28F 7/00* (2006.01)
*H05K 7/20* (2006.01)
(52) U.S. Cl. .................... 165/80.3; 165/185; 165/104.21
(58) Field of Classification Search ................. 165/80.3, 165/185, 104.21, 104.33; 361/697, 700, 361/704, 709; 257/715; 174/15.2, 16.3
See application file for complete search history.

(56) References Cited

U.S. PATENT DOCUMENTS

| | | | | |
|---|---|---|---|---|
| 5,199,165 | A * | 4/1993 | Crawford et al. | 29/846 |
| 5,355,942 | A * | 10/1994 | Conte | 165/104.33 |
| 5,712,762 | A * | 1/1998 | Webb | 361/679.54 |
| 6,407,921 | B1 * | 6/2002 | Nakamura et al. | 361/700 |
| 6,466,441 | B1 * | 10/2002 | Suzuki | 361/695 |
| 6,538,884 | B1 * | 3/2003 | Wong et al. | 361/688 |
| 6,778,390 | B2 * | 8/2004 | Michael | 361/695 |
| 7,443,680 | B1 * | 10/2008 | Peng et al. | 361/704 |

* cited by examiner

*Primary Examiner* — Tho V Duong
(74) *Attorney, Agent, or Firm* — J.C. Patents

(57) ABSTRACT

A heat dissipation module for being assembled to a circuit board with a first heat-generating element and a second heat-generating element is provided. A heat generation rate of the first heat-generating element is higher than that of the second heat-generating element. The heat dissipation module includes a heat-transferring connection element, a cooling device, a first heat-transferring plate and a second heat-transferring plate. The heat-transferring connection element has a first part and a second part. The cooling device connects to the first part. The first heat-transferring plate is connected between the first heat-generating element and the second part. The second heat-transferring plate has a third part and a fourth part. The second part is connected between the first heat-transferring plate and the third part. The fourth part is connected to the second heat-generating element. The thermal conductivity of the first heat-transferring plate is higher than that of the second heat-transferring plate.

12 Claims, 3 Drawing Sheets

US 7,954,541 B2

HEAT DISSIPATION MODULE

CROSS-REFERENCE TO RELATED APPLICATION

This application claims the priority benefit of Taiwan application serial no. 96131838, filed on Aug. 28, 2007. The entirety of the above-mentioned patent application is hereby incorporated by reference herein and made a part of this specification.

BACKGROUND OF THE INVENTION

1. Field of the Invention

The present invention relates to a heat dissipation module. More particularly, the present invention relates to a heat dissipation module for dissipating the heat generated by a plurality of heat-generating elements on a circuit board.

2. Description of Related Art

FIG. 1 is a schematic top view of a conventional heat dissipation module assembled to a circuit board. Referring to FIG. 1, a heat dissipation module 100, including a heat-transferring plate 110, a heat pipe 120, a fin assembly 130, and a fan 140, is disposed on a circuit board 200. A first part 112 of the heat-transferring plate 110 contacts a first chip 210 of the circuit board 200, and a second part 114 of the heat-transferring plate 110 contacts a second chip 220 of the circuit board 200. The first chip 210 is, for example, a central processing unit (CPU), and the second chip 220 is, for example, a graphic and memory controller hub (GMCH).

The heat pipe 120 is connected between the first part 112 of the heat-transferring plate 110 and the fin assembly 130, such that the heat generated by the first chip 210 and the second chip 220 can be transferred to the fin assembly 130 through the heat-transferring plate 110 and the heat pipe 120. The fan 140 cools the fin assembly 130 to prevent the first chip 210 and the second chip 220 from being damaged due to an over-high temperature.

It should be noted that, in the conventional art, the heat-transferring plate 110 is usually made of a whole copper plate with a higher thermal conductivity, so as to obtain better thermal conduction efficiency. However, as the copper plate has a higher density and a higher price, the heat dissipation module 100 in the conventional art is not only heavy in weight, but also has a high material cost.

Moreover, as the heat generation rate of the first chip 210 (CPU) is usually higher than that of the second chip 220 (GMCH), if the heat-transferring plate 110 is made of a whole copper plate with a better thermal conduction efficiency, the heat of the first chip 210 is easily transferred to the second chip 220 directly through the heat-transferring plate 110, thereby affecting the operating temperature of the second chip 220.

SUMMARY OF THE INVENTION

Accordingly, the present invention is directed to a heat dissipation module to reduce the overall weight, to lower down the material cost, and to solve the interference problem of the heats generated by the two heat-generating elements.

As embodied and broadly described herein, the present invention provides a heat dissipation module for being assembled to a circuit board with a first heat-generating element and a second heat-generating element. A heat generation rate of the first heat-generating element is higher than that of the second heat-generating element. The heat dissipation module includes a heat-transferring connection element, a cooling device, a first heat-transferring plate, and a second heat-transferring plate. The heat-transferring connection element has a first part and a second part. The cooling device is connected to the first part. The first heat-transferring plate is connected between the first heat-generating element and the second part. The second heat-transferring plate has a third part and a fourth part. The second part is connected between the first heat-transferring plate and the third part. The fourth part is connected to the second heat-generating element. The thermal conductivity of the first heat-transferring plate is higher than that of the second heat-transferring plate.

In an embodiment of the present invention, the heat-transferring connection element is a heat pipe.

In an embodiment of the present invention, the cooling device includes a fin assembly and a fan. The fin assembly is connected to the first part, and the fan is used to provide a cooling airflow to cool the fin assembly.

In an embodiment of the present invention, the first heat-transferring plate is substantially parallel to the third part of the second heat-transferring plate, and disposed in the range of the third part of the second heat-transferring plate. The density of the first heat-transferring plate is higher than that of the second heat-transferring plate.

In an embodiment of the present invention, the first heat-transferring plate is connected to the third part of the second heat-transferring plate by means of rivet joint.

In an embodiment of the present invention, the first heat-transferring plate is connected to the third part of the second heat-transferring plate via an insulation adhesive tape.

In an embodiment of the present invention, the insulation adhesive tape is made of a material with a low thermal conductivity.

In an embodiment of the present invention, the first heat-transferring plate is made of Cu.

In an embodiment of the present invention, the second heat-transferring plate is made of Al.

In an embodiment of the present invention, the heat dissipation module further includes two thermal conducting media. One of the thermal conducting media is disposed between the first heat-transferring plate and the first heat-generating element, and the other one is disposed between the second heat-transferring plate and the second heat-generating element.

In an embodiment of the present invention, the thermal conducting media are thermal greases.

In an embodiment of the present invention, the first heat-generating element is a CPU, and the second heat-generating element is a GMCH.

In the present invention, the first heat-generating element with a high heat generation rate is connected to the heat-transferring connection element through the first heat-transferring plate with a high thermal conductivity, and the second heat-generating element with a low heat generation rate is connected to the heat-transferring connection element through the second heat-transferring plate with a low thermal conductivity. Therefore, the heat generated by the first heat-generating element and that generated by the second heat-generating element are not easily affected with each other.

In order to make the aforementioned features and advantages of the present invention comprehensible, embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
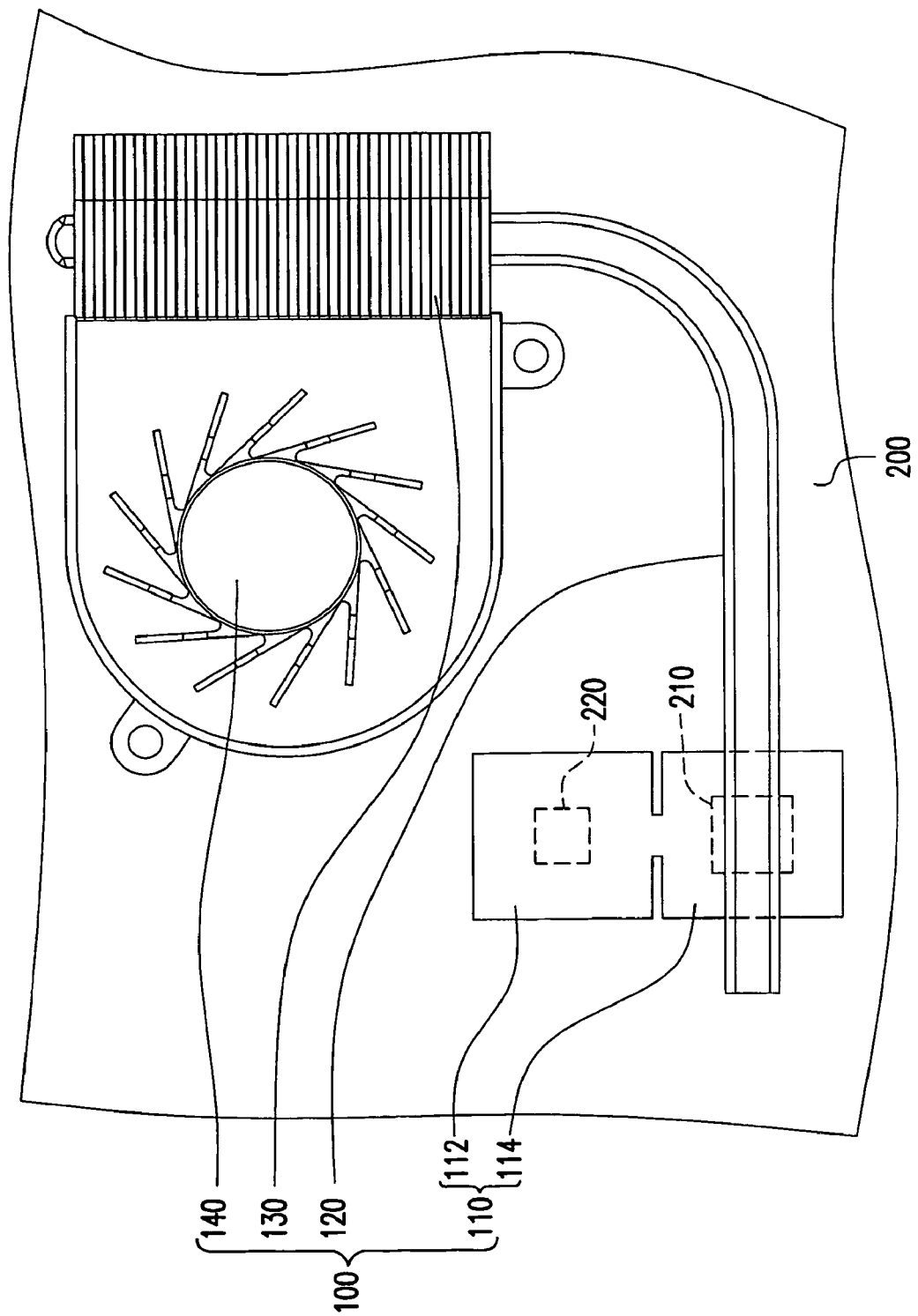
FIG. 1 is a schematic top view of a conventional heat dissipation module assembled to a circuit board.
Figure 2:
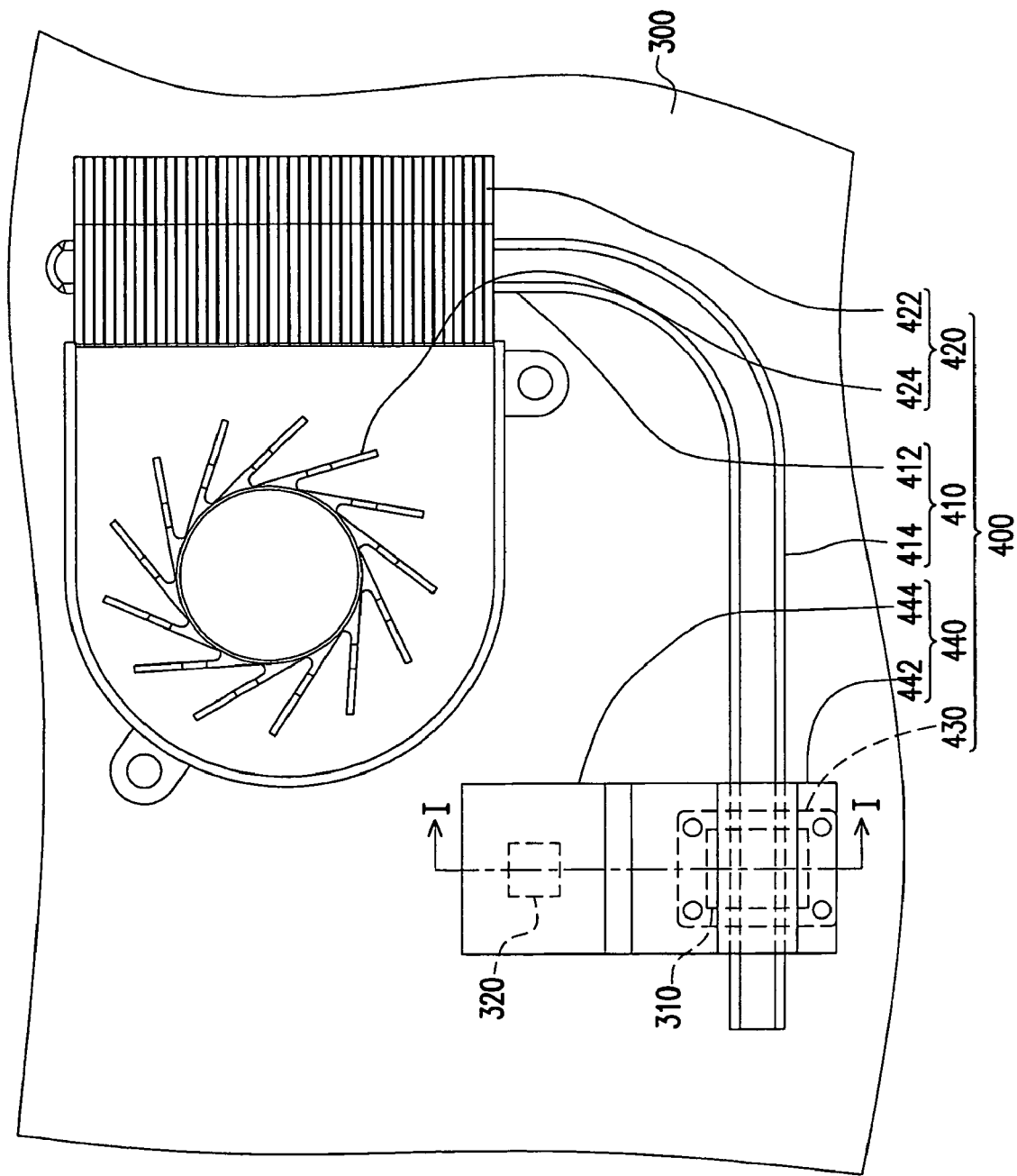
FIG. 2 is a schematic top view of a heat dissipation module assembled to a circuit board according to an embodiment of the present invention.
Figure 3:
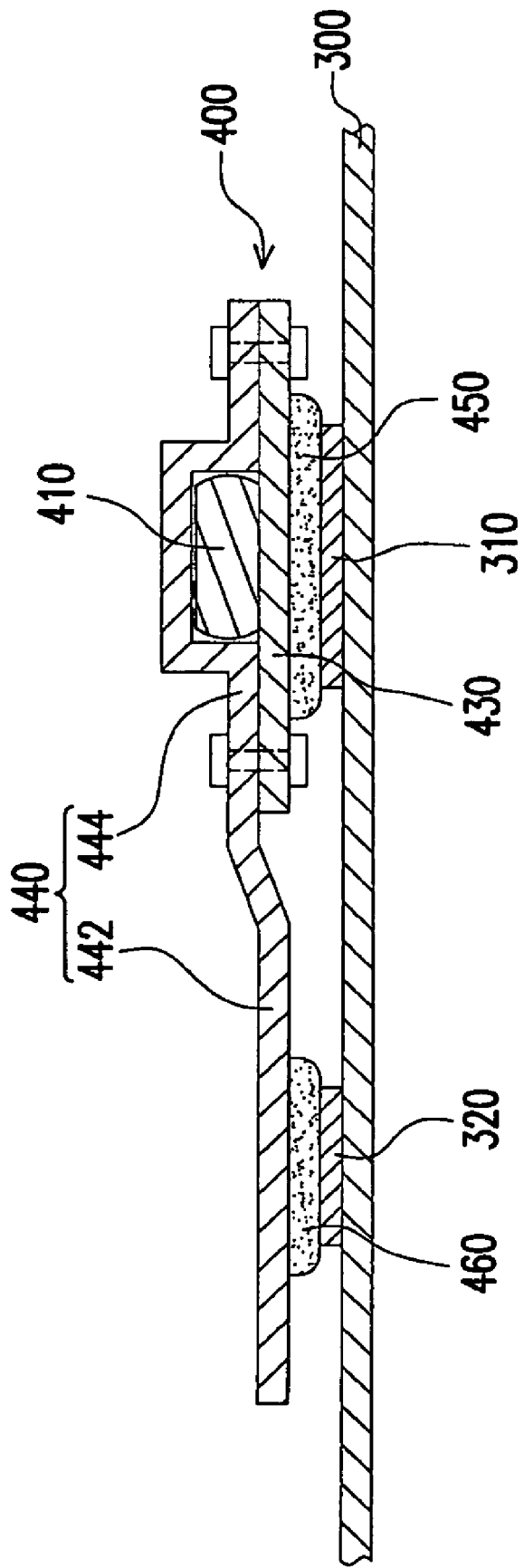
FIG. 3 is a cross-sectional view of FIG. 2 taken along Line I-I.

FIG. 2 is a schematic top view of a heat dissipation module assembled to a circuit board according to an embodiment of the present invention, and FIG. 3 is a cross-sectional view of FIG. 2 taken along Line I-I. Referring to FIGS. 2 and 3, in this embodiment, a circuit board 300 is, for example, a motherboard of a notebook PC, which has a first heat-generating element 310 and a second heat-generating element 320. The first heat-generating element 310 is, for example, a CPU, and the second heat-generating element 320 is, for example, a GMCH. The heat generation rate of the first heat-generating element 310 is higher than that of the second heat-generating element 320. However, in other embodiments, the second heat-generating element 320 can also be a video graphic array chip (VGA chip), a digital signal processor (DSP), a north bridge chip, a south bridge chip, or any other chip with a heat generation rate lower than that of CPU.

A heat dissipation module 400, including a heat-transferring connection element 410, a cooling device 420, a first heat-transferring plate 430, and a second heat-transferring plate 440, is assembled to the circuit board 300. The heat-transferring connection element 410 is, for example, a heat pipe, which has a first part 412 and a second part 414. The cooling device 420 includes a fin assembly 422 and a fan 424. The fin assembly 422 is connected to the first part 412 of the heat-transferring connection element 410, and the fan 424 is used to provide a cooling airflow to cool the fin assembly 422.

The first heat-transferring plate 430 is, for example, made of a copper plate, and connected between the first heat-generating element 310 and the second part 414 of the heat-transferring connection element 410. The second heat-transferring plate 440 is, for example, made of an aluminum plate, and has a third part 442 and a fourth part 444. The first heat-transferring plate 430 is, for example, connected to the third part 442 of the second heat-transferring plate 440 by means of rivet joint, such that the second part 414 of the heat-transferring connection element 410 is connected between the first heat-transferring plate 430 and the third part 442 of the second heat-transferring plate 440, and the fourth part 444 of the second heat-transferring plate 440 is connected to the second heat-generating element 320. The first heat-transferring plate 430 is, for example, substantially parallel to the third part 442 of the second heat-transferring plate 440, and disposed in the range of the third part 442 of the second heat-transferring plate 440.

In this embodiment, the first heat-generating element 310 and the second heat-generating element 320 are respectively connected to the heat-transferring connection element 410 through the first heat-transferring plate 430 and the second heat-transferring plate 440. Therefore, the second heat-generating element 320 (GMCH) with a lower heat generation rate may not be easily affected by the first heat-generating element 310 (CPU) with a higher heat generation rate, thus avoiding the problem of an over-high operating temperature.

Besides, both the density and price of the first heat-transferring plate 430 (copper plate) are higher than that of the second heat-transferring plate 440 (aluminium plate). Therefore, in the heat dissipation module 400 of the present invention, the second heat-transferring plate 440 (aluminium plate) is used to replace a large portion of the heat-transferring plate 110 (copper plate) in the conventional art, so the overall weight of the heat dissipation module 400 is reduced, and the material cost becomes lower.

However, the present invention is not limited to the above embodiment. For example, the first heat-transferring plate 430 can be connected to the third part 442 of the second heat-transferring plate 440 through an insulation adhesive tape with a low thermal conductivity (not shown), such that the first heat-transferring plate 430 does not directly contact the second heat-transferring plate 440, and thus the first heat-generating element 310 and the second heat-generating element 320 may not influence each other. The insulation adhesive tape is made of, for example, a material with a low thermal conductivity, for example, 4450 adhesive.

Furthermore, the heat dissipation module 400 further includes two thermal conducting media 450, 460 (shown in FIG. 3). The thermal conducting medium 450 is, for example, disposed between the first heat-transferring plate 430 and the first heat-generating element 310, and the thermal conducting medium 460 is, for example, disposed between the second heat-transferring plate 440 and the second heat-generating element 320. In this embodiment, the thermal conducting media are, for example, thermal greases, which can be used to enhance the thermal conduction efficiency between the heat-transferring plates 430, 440 and the heat-generating elements 310, 320.

In this embodiment, the heat dissipation module within a notebook PC is taken as an example for illustration. However, when being applied to a desktop PC or other electronic devices, heat dissipation peripheral elements such as the heat-transferring connection element 410 and the cooling device 420 formed by the fin assembly 422 and the fan 424 can be independently assembled within the case or integrally formed above the heat-generating element with a high heat generation rate through the stacking process. As such, the heat dissipation peripheral elements do not have to be assembled on the surface of a circuit board, which thus will not take up the available space of the circuit board. Furthermore, the heat dissipation peripheral elements can also be substituted by other heat dissipation elements. For example, besides using the fan 424 of the cooling device 420 to provide a cooling airflow, a pump can also be used to drive a cooling water to flow through the heat-transferring connection element 410, so as to conduct the heat to the outside. Therefore, the heat dissipation module 400 in the drawings of the present invention is only intended to illustrate at least one configuration of the embodiment of the present invention, but not to limit the present invention.

To sum up, in the present invention, the first heat-generating element with a high heat generation rate is connected to the heat-transferring connection element through the first heat-transferring plate with a high thermal conductivity, and the second heat-generating element with a low heat generation rate is connected to the heat-transferring connection element through the second heat-transferring plate with a low thermal conductivity. Therefore, the heat generated by the first heat-generating element and that generated by the second heat-generating element may not easily influence each other. Moreover, both the density and price of the first heat-transferring plate are higher than that of the second heat-transferring plate. Therefore, in the heat dissipation module of the present invention, the second heat-transferring plate is used to replace a large portion of the heat-transferring plate in the conventional art, so the overall weight of the heat dissipation module is reduced, and the material cost becomes lower.

Though the present invention has been disclosed above by the embodiments, they are not intended to limit the present invention. Those of ordinary skill in the art can make some modifications and variations without departing from the spirit and scope of the present invention. Therefore, the protecting range of the present invention falls in the appended claims.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A heat dissipation module, for being assembled to a circuit board with a first heat-generating element and a second heat-generating element, wherein a heat generation rate of the first heat-generating element is higher than that of the second heat-generating element, the heat dissipation module comprising:
   a heat-transferring connection element, having a first part and a second part;
   a cooling device, connected to the first part;
   a first heat-transferring plate, connected between the first heat-generating element and the second part; and
   a second heat-transferring plate, having a third part and a fourth part, wherein the second part is connected between the first heat-transferring plate and the third part, the fourth part is connected to the second heat-generating element, and a thermal conductivity of the first heat-transferring plate is higher than that of the second heat-transferring plate.

2. The heat dissipation module as claimed in claim 1, wherein the heat-transferring connection element is a heat pipe.

3. The heat dissipation module as claimed in claim 1, wherein the cooling device comprises:
   a fin assembly, connected to an end of the heat-transferring connection element; and
   a fan, for providing a cooling airflow to cool the fin assembly.

4. The heat dissipation module as claimed in claim 1, wherein the first heat-transferring plate is substantially parallel to the third part, and disposed in the range of the third part; the density of the first heat-transferring plate is higher than that of the second heat-transferring plate.

5. The heat dissipation module as claimed in claim 1, wherein the first heat-transferring plate is connected to the third part by means of rivet joint.

6. The heat dissipation module as claimed in claim 1, wherein the first heat-transferring plate is connected to the third part via an insulation adhesive tape.

7. The heat dissipation module as claimed in claim 6, wherein the insulation adhesive tape is made of a material with a low thermal conductivity.

8. The heat dissipation module as claimed in claim 1, wherein the first heat-transferring plate is made of Cu.

9. The heat dissipation module as claimed in claim 1, wherein the second heat-transferring plate is made of Al.

10. The heat dissipation module as claimed in claim 1, further comprising two thermal conducting media, wherein one of the thermal conducting media is disposed between the first heat-transferring plate and the first heat-generating element, and the other of the thermal conducting media is disposed between the second heat-transferring plate and the second heat-generating element.

11. The heat dissipation module as claimed in claim 10, wherein the thermal conducting media are thermal greases.

12. The heat dissipation module as claimed in claim 1, wherein the first heat-generating element is a central processing unit (CPU), and the second heat-generating element is a graphic and memory controller hub (GMCH).

* * * * *